United States Patent
Lee et al.

(10) Patent No.: US 9,793,217 B2
(45) Date of Patent: Oct. 17, 2017

(54) PACKAGE-ON-PACKAGE TYPE SEMICONDUCTOR DEVICE WHICH IS REALIZED THROUGH APPLYING NOT A TSV TECHNOLOGY BUT A FAN-OUT WAFER LEVEL PACKAGE TECHNOLOGY

(71) Applicant: SK hynix Inc., Icheon-si, Gyeonggi-do (KR)

(72) Inventors: Sang Eun Lee, Chuncheon-si (KR); Seung Taek Yang, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 27 days.

(21) Appl. No.: 14/809,710

(22) Filed: Jul. 27, 2015

(65) Prior Publication Data
US 2016/0329298 A1   Nov. 10, 2016

(30) Foreign Application Priority Data
May 6, 2015   (KR) .......................... 10-2015-0062958

(51) Int. Cl.
*H01L 25/065*   (2006.01)
*H01L 23/538*   (2006.01)
(Continued)

(52) U.S. Cl.
CPC ........ *H01L 23/5386* (2013.01); *H01L 25/105* (2013.01); *H01L 23/3128* (2013.01); *H01L 23/49816* (2013.01); *H01L 23/5384* (2013.01); *H01L 23/5389* (2013.01); *H01L 24/16* (2013.01); *H01L 24/32* (2013.01); *H01L 24/48* (2013.01); *H01L 24/73* (2013.01); *H01L 25/0657* (2013.01); *H01L 2224/0401* (2013.01); *H01L 2224/04042* (2013.01); *H01L 2224/04105* (2013.01); *H01L 2224/12105* (2013.01); *H01L 2224/16227* (2013.01); *H01L 2224/32145* (2013.01); *H01L 2224/32225* (2013.01); *H01L 2224/48091* (2013.01); *H01L 2224/48227* (2013.01); *H01L 2224/73253* (2013.01); *H01L 2224/73265* (2013.01);
(Continued)

(58) Field of Classification Search
CPC . H01L 25/18; H01L 23/3114; H01L 25/0657; H01L 1/112; H01L 24/17; H01L 23/50; H01L 23/481; H01L 24/49; H01L 25/065; H01L 23/538; H01L 23/00; H01L 27/08; H01L 23/31; H01L 24/09; H01L 23/5384; H01L 23/5386; H05K 1/112; H05K 1/181
USPC ....... 257/686, 723, 777, 778, 685, 738, 784, 257/786, 737, 734
See application file for complete search history.

(56) References Cited

U.S. PATENT DOCUMENTS

| | | |
|---|---|---|
| 2013/0168856 A1 | 7/2013 | Wang et al. |
| 2014/0091471 A1 | 4/2014 | Chen et al. |

(Continued)

*Primary Examiner* — Alexander Oscar Williams
(74) *Attorney, Agent, or Firm* — William Park & Associates Ltd.

(57) ABSTRACT

A semiconductor device may include a bottom package embedded with a first semiconductor chip. The semiconductor device may include a middle package stacked over the bottom package, and embedded with at least two second semiconductor chips in a fan-out structure. The semiconductor device may include a top package stacked over the middle package, and embedded with at least two third semiconductor chips.

13 Claims, 6 Drawing Sheets

(51) Int. Cl.
*H01L 23/00* (2006.01)
*H01L 23/31* (2006.01)
*H01L 25/10* (2006.01)
*H01L 23/498* (2006.01)

(52) U.S. Cl.
CPC .............. *H01L 2224/73267* (2013.01); *H01L 2225/0651* (2013.01); *H01L 2225/06575* (2013.01); *H01L 2225/1023* (2013.01); *H01L 2225/1058* (2013.01); *H01L 2924/00014* (2013.01); *H01L 2924/1431* (2013.01); *H01L 2924/1436* (2013.01); *H01L 2924/1533* (2013.01); *H01L 2924/15311* (2013.01); *H01L 2924/182* (2013.01); *H01L 2924/18161* (2013.01); *H01L 2924/18162* (2013.01)

(56) References Cited

U.S. PATENT DOCUMENTS

| | | | |
|---|---|---|---|
| 2015/0206866 A1* | 7/2015 | Yu | H01L 25/18 257/738 |
| 2016/0049385 A1* | 2/2016 | Yu | H01L 23/481 257/774 |
| 2016/0079220 A1* | 3/2016 | Lin | H01L 25/0652 361/783 |

* cited by examiner

PACKAGE-ON-PACKAGE TYPE SEMICONDUCTOR DEVICE WHICH IS REALIZED THROUGH APPLYING NOT A TSV TECHNOLOGY BUT A FAN-OUT WAFER LEVEL PACKAGE TECHNOLOGY

CROSS-REFERENCE TO RELATED APPLICATION

The present application claims priority under 35 U.S.C. §119(a) to Korean Patent Application No. 10-2015-0062958, filed on May 6, 2015, in the Korean Intellectual Property Office, which is incorporated herein by reference in its entirety.

BACKGROUND

1. Technical Field

Various embodiments generally relate to a semiconductor device, and more particularly, to a package-on-package type semiconductor device. The package-on-package type semiconductor device may be realized by stacking an SoC package, a fan-out memory package and an external memory package.

2. Related Art

As electronic products are gradually downsized and highly functionalized, semiconductor chips having high capacities are needed to satisfy desired functions. Thus, it is necessary to mount an increased number of semiconductor chips on a small-sized electronic product.

In this regard, because technologies for manufacturing semiconductor chips with high capacity or mounting an increased number of semiconductor chips in a limited space has its limitations, a recent trend is directed toward embedding an increased number of semiconductor chips in a single package. Under this situation, various technologies for improving electrical characteristics without increasing the overall thickness of a package even though one or more semiconductor chips are embedded are being developed.

With the rapid growth of a mobile market due to the explosion in needs for smart phones and tablets, memories have evolved at very high speed with their increasing types. For instance, a Wide I/O 2 (hereinafter, referred to as 'WIO2') mobile DRAM memory chip, which is a faster version of a Wide I/O mobile DRAM memory chip having a plurality of I/O pins has been introduced.

Such a WIO2 mobile DRAM memory chip generally requires the application of a TSV (through-silicon via) technology. By staking a plurality of chips through forming TSVs, it is possible to realize a mobile product having a small overall size with a high capacity and still being capable of operating at high speeds.

SUMMARY

In an embodiment, a semiconductor device may be provided. The semiconductor device may include a bottom package embedded with a first semiconductor chip. The semiconductor device may include a middle package stacked over the bottom package, and embedded with at least two second semiconductor chips in a fan-out structure. The semiconductor device may include a top package stacked over the middle package, and embedded with at least two third semiconductor chips.

In an embodiment, an electronic system may be provided. The electronic system may be applied with a package-on-package type semiconductor device. The electronic system may include a controller, an interface, an input/output unit and a memory device. The controller, interface, input/output unit and the memory device may all be electrically coupled to each other by a bus. The controller and the memory device may include a bottom package embedded with a first semiconductor chip, a middle package stacked over the bottom package and embedded with at least two second semiconductor chips in a fan-out structure, and a top package stacked over the middle package and embedded with at least two third semiconductor chips.

In an embodiment, a memory card may be provided. The memory card may include a package-on-package type semiconductor device. The memory card may include a memory including the package-on-package type semiconductor device and a memory controller configured to control the memory. The package-on-package type semiconductor device may include a bottom package embedded with a first semiconductor chip, a middle package stacked over the bottom package and embedded with at least two second semiconductor chips in a fan-out structure, and a top package stacked over the middle package and embedded with at least two third semiconductor chips.

DETAILED DESCRIPTION

Hereinafter, a package-on-package type semiconductor device including a fan-out memory device will be described below with reference to the accompanying drawings through various examples of embodiments.

Various embodiments provide package-on-package type semiconductor devices. The package-on-package type semiconductor devices may be realized without applying a TSV technology to a WIO2 mobile DRAM memory chip.

Figure 1:
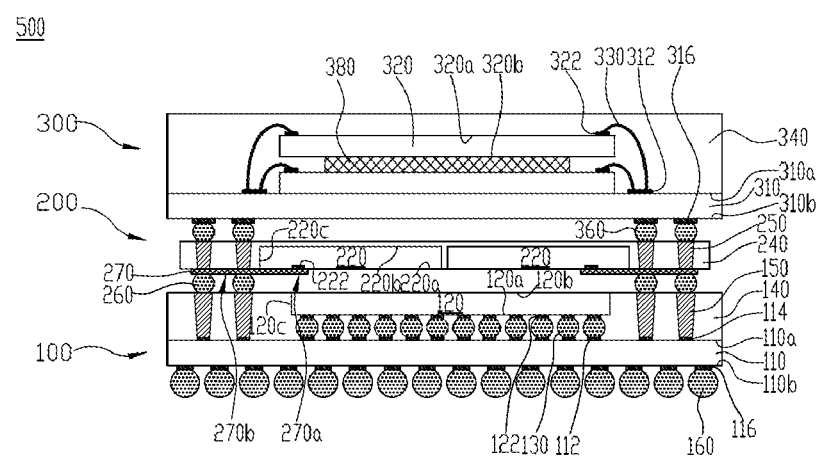
FIG. 1 is a cross-sectional view illustrating a representation of an example of a package-on-package type semiconductor device in accordance with an embodiment.

Referring to FIG. 1, a package-on-package type semiconductor device 500 in accordance with an embodiment may include a middle package 200 of a fan-out package structure. WIO2 mobile DRAM memory chips may be embedded in the fan-out package structure. The semiconductor device 500 in accordance with an embodiment may include a bottom package 100 and a top package 300. The bottom package 100 and the top package 300 may be respectively stacked under and over the middle package 200 with the fan-out package structure.

In an embodiment, the bottom package 100 may be defined to have an SoC (system-on-chip) package structure, and may include a first substrate 110, a first semiconductor chip 120, and first connection members 130. The bottom package 100 may include a first encapsulation member 140, first through electrodes 150, and first connection terminals 160.

The first substrate 110 may be a printed circuit board, and may have a substantially quadrangular plate shape. The first substrate 110 may have a top surface 110a and a bottom surface 110b. The bottom surface 110b may face away from the top surface 110a. The first substrate 110 may include a plurality of first bond fingers 112 and a plurality of first connection electrodes 114. The first connection electrodes 114 may be disposed on the top surface 110a. The first substrate 110 may include a plurality of first external electrodes 116 disposed on the bottom surface 110b. The first bond fingers 112 may be substantially arranged on the center portion of the top surface 110a of the first substrate 110. The first connection electrodes 114 may be arranged in a plurality of lines on the peripheral portions of the top surface 110a of the first substrate 110 outside the first bond fingers 112.

While not illustrated, the first substrate 110 may further include via patterns formed therein. By the via patterns, the first bond fingers 112 and the first connection electrodes 114 arranged on the top surface 110a of the first substrate 110 and the first external electrodes 116 arranged on the bottom surface 110b of the first substrate 110 may be electrically interconnected in one-to-one correspondence.

The first semiconductor chip 120 may be, for example, a logic chip for driving, and may have a substantially quadrangular plate shape. The first semiconductor chip 120 constructed by a logic chip may have a front surface 120a and a rear surface 120b. The rear surface 120b may face away from the front surface 120a. The first semiconductor chip 120 may include a plurality of first bonding pads 122 arranged on the front surface 120a. The first semiconductor chip 120 may be disposed in a face-down type over the portion of the top surface 110a of the first substrate 110, on which the first bond fingers 112 are formed, such that the front surface 120a of the first semiconductor chip 120, on which the first bonding pads 122 are formed, faces downward.

The first connection members 130 are respectively formed on the first bonding pads 122 of the first semiconductor chip 120 to allow the first semiconductor chip 120 to be flip chip-bonded to the top surface 110a of the first substrate 110. The first connection members 130 electrically connect the first bond fingers 112 of the first substrate 110 and the corresponding first bonding pads 122 of the first semiconductor chip 120. The first connection members 130 may include bumps.

The first encapsulation member 140 may include an epoxy molding compound, and be formed on the top surface 110a of the first substrate 110 to cover or substantially cover the first semiconductor chip 120 and the first connection electrodes 114. The first encapsulation member 140 may be formed to cover or substantially cover the front surface 120a and side surfaces 120c of the first semiconductor chip 120 and expose the rear surface 120b of the first semiconductor chip 120. While not illustrated, the first encapsulation member 140 may be formed to cover or substantially cover the rear surface 120b of the first semiconductor chip 120.

The first through electrodes 150 as being formed to be electrically connected with the middle package 200 or the top package 300 may be formed in the first encapsulation member 140 to be respectively connected with the first connection electrodes 114 of the first substrate 110. While not illustrated, the first through electrodes 150 may be formed by defining holes, which respectively expose the first connection electrodes 114, in the first encapsulation member 140 through a laser drilling process or an etching process and filling a conductive layer in the holes. The filling of the conductive layer may be performed using any one of a plating process or a deposition process.

The first connection terminals 160 may include solder balls, and may be respectively formed on the first external electrodes 116 arranged on the bottom surface 110b of the first substrate 110. The first connection terminals 160 may serve as means for mounting the package-on-package type semiconductor device 500 in accordance with an embodiment to a main board.

In an embodiment, the middle package 200 may be defined to have a fan-out package structure, and may include at least two, for example, two second semiconductor chips 220, a second encapsulation member 240, second through electrodes 250, redistribution lines 270, and second connection terminals 260.

Each of the second semiconductor chips 220 may be a WIO2 mobile DRAM memory chip having a plurality of I/O pins and configured to operate at a high speed, and may have a substantially quadrangular plate shape. Each of the second semiconductor chips 220, constructed by a WIO2 mobile DRAM memory chip, may have a front surface 220a. A plurality of second bonding pads 222 may be arranged on the front surface 220a. Each of the second semiconductor chips 220, constructed by a WIO2 mobile DRAM memory chip, may have a rear surface 220b facing away from the front surface 220a, and side surfaces 220c connecting the front surface 220a and the rear surface 220b. The second semiconductor chips 220 may be disposed in a face-down type on the same plane such that they are separated from each other and their front surfaces 220a face downward. The second bonding pads 222 of the second semiconductor chips 220 may be arranged on the peripheral portions of the front surfaces 220a. The second bonding pads 222 of the second semiconductor chips 220 may be opposite to each other.

While not illustrated, it is to be understood that a dielectric protection layer formed of polyimide may be disposed on the front surfaces 220a of the second semiconductor chips 220. While not illustrated, it is to be understood that a dielectric layer may be additionally formed on the protection layer for electrical insulation with respect to the redistribution lines 270 which will be described below.

The second encapsulation member 240 may include an epoxy molding compound. The second encapsulation member 240 may be formed to expose the front surfaces 220a of the second semiconductor chips 220 disposed to be separated from each other and may cover the rear surfaces 220b and the side surfaces 220c of the second semiconductor chips 220. While not illustrated, the second encapsulation member 240 may be formed to expose the front surfaces 220a and the rear surfaces 220b of the second semiconductor chips 220 and cover only the side surfaces 220c such that the heat generated during driving of the second semiconductor chips 220 may be quickly discharged to an exterior.

The redistribution lines 270 electrically connected with the bottom package 100 and the top package 300 may be formed of a metal with excellent conductivity such as copper, and may have a substantial line shape. The redistribution lines 270 may have one ends 270a and the other ends 270b extending from the one ends 270a and may be positioned opposite to the one ends 270a. The one ends 270a of the redistribution lines 270 may be connected with the second bonding pads 222 of the second semiconductor chips 220, and the other ends 270b of the redistribution lines 270 may be disposed on portions of the second encapsulation member 240 corresponding to the other ends 270b of the redistribution lines 270.

While not illustrated, the redistribution lines 270 may have various extending structures when viewed from the top, and may include second external electrodes disposed on the other ends 270b and on which the second connection terminals 260 are to be formed.

The second through electrodes 250 as being formed to be electrically connected with the bottom package 100 and the top package 300 may be formed to vertically pass through the second encapsulation member 240, and may be formed to be respectively electrically connected with the redistribution lines 270. Similarly to the first through electrodes 150, the second through electrodes 250 may be formed by defining holes, which respectively expose the other ends 270b of the redistribution lines 270, in the second encapsulation member 240 through a laser drilling or etching process and filling a conductive layer in the holes through a plating or deposition process.

The second connection terminals 260 may include, for example, solder balls. The second connection terminals 260 may be respectively formed on the other ends 270b of the redistribution lines 270, and may be electrically connected with the first through electrodes 150 of the bottom package 100. Accordingly, the second connection terminals 260 may electrically interconnect the first through electrodes 150 of the bottom package 100 and the corresponding second through electrodes 250 of the middle package 200.

In an embodiment, the top package 300 may be defined to have a vertical stack package structure, and may include a third substrate 310, third semiconductor chips 320, and third connection members 330. The top package 300 may include a third encapsulation member 340, third connection terminals 360, and a spacer 380.

The third substrate 310 may be a printed circuit board, and may have a substantially quadrangular plate shape. The third substrate 310 may have a top surface 310a and a bottom surface 310b facing away from the top surface 310a. The third substrate 310 may include a plurality of third bond fingers 312 disposed on the top surface 310a and a plurality of third external electrodes 316 disposed on the bottom surface 310b. The third bond fingers 312 may be arranged on the peripheral portions of the top surface 310a of the third substrate 310. The third external electrodes 316 may be arranged on the bottom surface 310b of the third substrate 310 to have various arrangement structures when viewed from the top.

While not illustrated, the third substrate 310 may further include via patterns formed within the third substrate 310. By the via patterns, the third bond fingers 312 arranged on the top surface 310a of the third substrate 310 and the third external electrodes 316 arranged on the bottom surface 310b of the third substrate 310 may be electrically interconnected in one-to-one correspondence.

Each of the third semiconductor chips 320 may be, for example, a low power double data rate (DDR) memory chip, and may have a substantially quadrangular plate shape. Each of the third semiconductor chips 320 constructed by a low power DDR memory chip may have a front surface 320a and a rear surface 320b facing away from the front surface 320a. The third semiconductor chips 320 may include a plurality of third bonding pads 322 arranged on the peripheral portions of the front surface 320a. At least two, for example, two such third semiconductor chips 320 may be vertically stacked in a face-up type on the top surface 310a of the third substrate 310 by the medium of adhesive members (not illustrated) such that their front surfaces 320a, on which the third bonding pads 322 are formed, face upward. The spacer 380 may be interposed between the stacked third semiconductor chips 320 such that the connection of the third connection members 330 to the third bonding pads 322 may be stably implemented. The spacer 380 may include a dielectric substrate, a glass substrate, or a bare chip formed with no circuit.

The third connection members 330 may include conductive wires, and may be formed to electrically interconnect the third bonding pads 322 of the third semiconductor chips 320 and the third bond fingers 312 of the third substrate 310 disposed adjacent to the third bonding pads 322 of the third semiconductor chips 320.

The third encapsulation member 340 may include an epoxy molding compound, and be formed on the top surface 310a of the third substrate 310 to cover or substantially cover the third semiconductor chips 320 and the third bond fingers 312.

The third connection terminals 360 may include solder balls, and may be respectively formed on the third external electrodes 316 arranged on the bottom surface 310b of the third substrate 310. The third connection terminals 360 may contact the second through electrodes 250 of the middle package 200, and accordingly, may electrically interconnect the third external electrodes 316 of the top package 300 and the corresponding second through electrodes 250 of the middle package 200.

In the above-described semiconductor device 500, a package including WIO2 mobile DRAM memory chips may be realized through applying not a TSV technology but a fan-out wafer level package technology, and by stacking an SoC package and an external memory package under and over a fan-out package, the semiconductor device 500 may be realized to have a package-on-package structure when viewed in its entirety.

As a consequence, in the embodiments, by fabricating WIO2 mobile DRAM memory chips into a fan-out package structure, it may be possible to solve a problem which is likely to be caused due to the fact that it is difficult to apply a TSV technology to a WIO2 mobile DRAM package, and thus, it may be possible to realize various shapes of a package-on-package type semiconductor device capable of allowing a driving package and an external memory package to be easily stacked.

Figure 2:
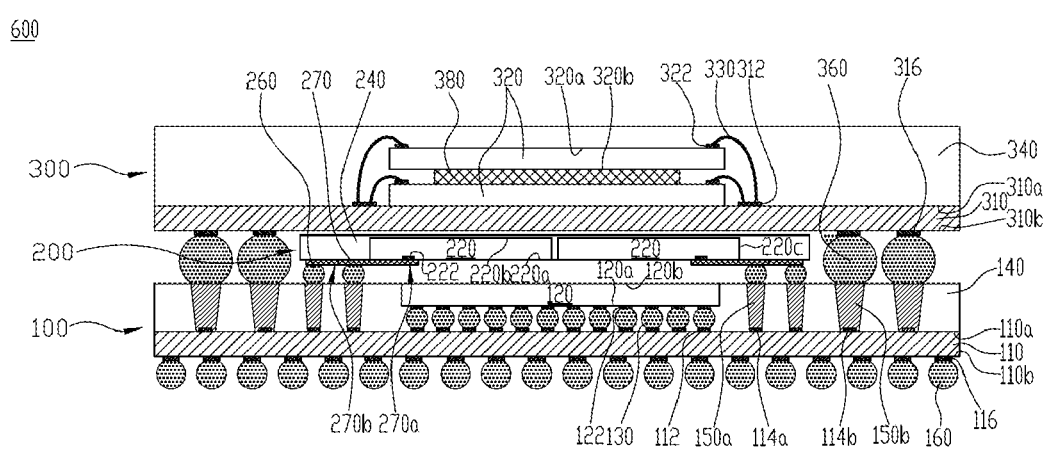
FIG. 2 is a cross-sectional view illustrating a representation of an example of a package-on-package type semiconductor device in accordance with an embodiment.

Referring to FIG. 2, a semiconductor device 600 in accordance with an embodiment may include a bottom package 100, a middle package 200, and a top package 300.

In an embodiment, the bottom package 100 may be defined to have an SoC package structure, and may include a first substrate 110, a first semiconductor chip 120, and first connection members 130. The bottom package 100 may include a first encapsulation member 140, first through electrodes 150a and 150b, and first connection terminals 160.

The first substrate 110 may be a printed circuit board, may have a top surface 110a and a bottom surface 110b facing away from the top surface 110a. The first substrate 110 may include a plurality of first bond fingers 112 and a plurality of first connection electrodes 114a and 114b disposed on the top surface 110a and a plurality of first external electrodes 116 disposed on the bottom surface 110b. In an embodiment, the first connection electrodes 114a and 114b may include first connection electrodes 114a for connection to the middle package 200 disposed outside the first bond fingers 112, and first connection electrodes 114*b* for connection to the top package 300 disposed outside the first connection electrodes 114*a* for connection to the middle package 200.

While not illustrated, the first substrate 110 may further include via patterns formed within the first substrate 110. By the via patterns, the first bond fingers 112 and the first connection electrodes 114*a* and 114*b* arranged on the top surface 110*a* of the first substrate 110 and the first external electrodes 116 arranged on the bottom surface 110*b* of the first substrate 110 may be electrically interconnected.

The first semiconductor chip 120 may be a logic chip, may have a front surface 120*a* and a rear surface 120*b* facing away from the front surface 120*a*. The first semiconductor chip 120 may include a plurality of first bonding pads 122 arranged on the front surface 120*a*. The first semiconductor chip 120 may be disposed in a face-down type on the top surface 110*a* of the first substrate 110.

The first connection members 130 may include bumps, and are interposed between the first bond fingers 112 of the first substrate 110 and the first bonding pads 122 of the first semiconductor chip 120 and physically and electrically connect the first bond fingers 112 and the first bonding pads 122.

The first encapsulation member 140 may include an epoxy molding compound, and be formed on the top surface 110*a* of the first substrate 110 to cover or substantially cover the first semiconductor chip 120 and the first connection electrodes 114*a* and 114*b*. The first encapsulation member 140 may be formed to expose the rear surface 120*b* of the first semiconductor chip 120, and although not illustrated, may be formed to cover or substantially cover the rear surface 120*b* of the first semiconductor chip 120.

The first through electrodes 150*a* and 150*b* may be formed in the first encapsulation member 140, and may include first through electrodes 150*a* for connection to the middle package 200 and first through electrodes 150*b* for connection to the top package 300. The first through electrodes 150*a* for connection to the middle package 200 may be formed to be respectively connected with the first connection electrodes 114*a* for connection to the middle package 200, and the first through electrodes 150*b* for connection to the top package 300 may be formed to be respectively connected with the first connection electrodes 114*b* for connection to the top package 300. In an present embodiment, the first through electrodes 150*a* for connection to the middle package 200 may be formed in portions of the first encapsulation member 140 adjacent to the first semiconductor chip 120, and the first through electrodes 150*b* for connection to the top package 300 may be formed in portions of the first encapsulation member 140 outside the first through electrodes 150*a* for connection to the middle package 200.

The first connection terminals 160 may include solder balls, and may be respectively formed on the first external electrodes 116 arranged on the bottom surface 110*b* of the first substrate 110. The first connection terminals 160 may serve as means for mounting the package-on-package type semiconductor device 600 in accordance with an embodiment to a main board.

In an embodiment, the middle package 200 may be defined to have a fan-out package structure, and may include at least two, for example, two second semiconductor chips 220, a second encapsulation member 240, redistribution lines 270, and second connection terminals 260.

Each of the second semiconductor chips 220 may be a WIO2 mobile DRAM memory chip, and may have a front surface 220*a* on which a plurality of second bonding pads 222 are arranged, a rear surface 220*b* facing away from the front surface 220*a*, and side surfaces 220*c* connecting the front surface 220*a* and the rear surface 220*b*. The second semiconductor chips 220 may be disposed in a face-down type on the same plane in such a way as to be separated from each other.

The second encapsulation member 240 may include an epoxy molding compound, and be formed to expose the front surfaces 220*a* of the second semiconductor chips 220 and cover or substantially cover the rear surfaces 220*b* and the side surfaces 220*c* of the second semiconductor chips 220. While not illustrated, the second encapsulation member 240 may be formed to expose the front surfaces 220*a* and the rear surfaces 220*b* of the second semiconductor chips 220 and cover or substantially cover only the side surfaces 220*c*.

The redistribution lines 270 may be formed of a metal such as copper, and may have one ends 270*a* and the other ends 270*b*. The one ends 270*a* of the redistribution lines 270 may be connected with the second bonding pads 222 of the second semiconductor chips 220, and the other ends 270*b* of the redistribution lines 270 may be disposed on portions of the second encapsulation member 240 corresponding to the other ends 270*b* of the redistribution lines 270. While not illustrated, the redistribution lines 270 may include second external electrodes disposed on the other ends 270*b* and on which the second connection terminals 260 are to be formed.

The second connection terminals 260 may include solder balls. The second connection terminals 260 may be respectively formed on the second external electrodes disposed on the other ends 270*b* of the redistribution lines 270, and may be electrically connected with the first through electrodes 150*a* of the bottom package 100 for connection to the middle package 200. Accordingly, the first through electrodes 150*a* of the bottom package 100 for connection to the middle package 200 and the corresponding redistribution lines 270 of the middle package 200 may be electrically interconnected by the second connection terminals 260.

In an embodiment, the top package 300 may be defined to have a vertical stack package structure, and may include a third substrate 310, third semiconductor chips 320, and third connection members 330. The top package 300 may include a third encapsulation member 340, third connection terminals 360, and a spacer 380.

The third substrate 310 may be a printed circuit board, may have a top surface 310*a* and a bottom surface 310*b* facing away from the top surface 310*a*, and may include a plurality of third bond fingers 312 disposed on the top surface 310*a* and a plurality of third external electrodes 316 disposed on the bottom surface 310*b*. While not illustrated, the third substrate 310 may further include via patterns formed therein. By the via patterns, the third bond fingers 312 arranged on the top surface 310*a* of the third substrate 310 and the third external electrodes 316 arranged on the bottom surface 310*b* of the third substrate 310 may be electrically interconnected.

Each of the third semiconductor chips 320 may be a low power DDR memory chip, may have a front surface 320*a* and a rear surface 320*b* facing away from the front surface 320*a*, and may include a plurality of third bonding pads 322 arranged on the peripheral portions of the front surface 320*a*. At least two, for example, two such third semiconductor chips 320 may be vertically stacked in a face-up type on the top surface 310*a* of the third substrate 310. The stacking of the third semiconductor chips 320 may be carried out by the medium of adhesive members (not illustrated), and the spacer 380 may be interposed between the stacked third semiconductor chips 320 to retain the space therebetween.

The third connection members 330 may include conductive wires, and may be formed to electrically interconnect the third bonding pads 322 of the third semiconductor chips 320 and the third bond fingers 312 of the third substrate 310 disposed adjacent to the third bonding pads 322 of the third semiconductor chips 320.

The third encapsulation member 340 may include an epoxy molding compound, and be formed on the top surface 310a of the third substrate 310 to cover or substantially cover the third semiconductor chips 320 and the third bond fingers 312.

The third connection terminals 360 may include solder balls, and may be respectively formed on the third external electrodes 316 arranged on the bottom surface 310b of the third substrate 310. The third connection terminals 360 may be formed to contact the first through electrodes 150b of the bottom package 100 for connection to the top package 300, and accordingly, the third external electrodes 316 of the top package 300 and the respectively corresponding first through electrodes 150b of the bottom package 100 for connection to the top package 300 may be electrically interconnected by the third connection terminals 360.

The third connection terminals 360 may be formed to have a larger diameter when compared to those of the aforementioned embodiments. For example, the third connection terminals 360 may be formed to have a diameter that allows the first through electrodes 150b of the bottom package 100 for connection to the top package 300 and the third external electrodes 316 of the top package 300 to be stably electrically connected even though the middle package 200 is interposed between the bottom package 100 and the top package 300.

Figure 3:
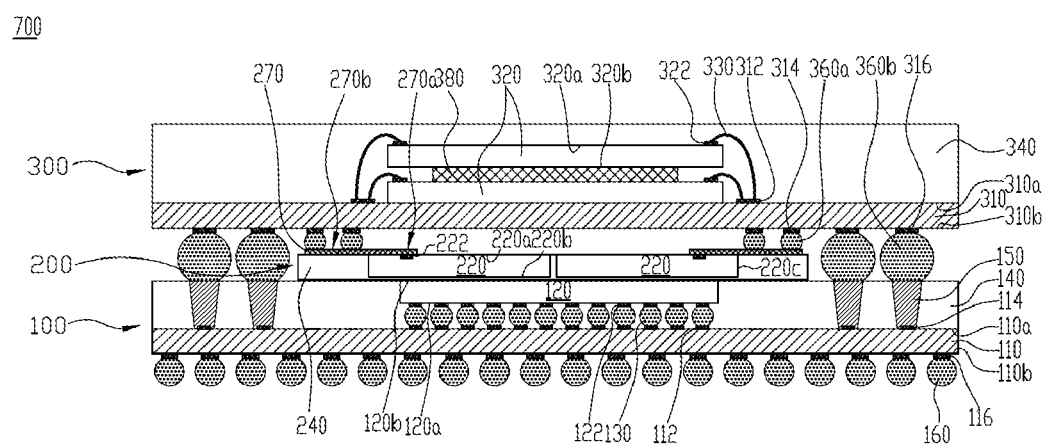
FIG. 3 is a cross-sectional view illustrating a representation of an example of a package-on-package type semiconductor device in accordance with an embodiment.

Referring to FIG. 3, a semiconductor device 700 in accordance with an embodiment may include a bottom package 100, a middle package 200, and a top package 300.

In an embodiment, the bottom package 100 may be defined to have an SoC package structure, and may include a first substrate 110, a first semiconductor chip 120, and first connection members 130. The bottom package 100 may include a first encapsulation member 140, first through electrodes 150, and first connection terminals 160.

The first substrate 110 may be a printed circuit board, may have a top surface 110a and a bottom surface 110b facing away from the top surface 110a. The first substrate 110 may include a plurality of first bond fingers 112 and a plurality of first connection electrodes 114 disposed on the top surface 110a and a plurality of first external electrodes 116 disposed on the bottom surface 110b. While not illustrated, the first substrate 110 may further include via patterns formed within the substrate. By the via patterns, the first bond fingers 112 and the first connection electrodes 114 and the first external electrodes 116 may be electrically interconnected.

The first semiconductor chip 120 may be a logic chip, may have a front surface 120a and a rear surface 120b facing away from the front surface 120a. The first semiconductor chip 120 may include a plurality of first bonding pads 122 arranged on the front surface 120a. The first semiconductor chip 120 may be disposed in a face-down type on the top surface 110a of the first substrate 110.

The first connection members 130 may include bumps, and may be interposed between the first bond fingers 112 of the first substrate 110 and the first bonding pads 122 of the first semiconductor chip 120. The first connection members 130 may physically and electrically connect the first bond fingers 112 and the first bonding pads 122.

The first encapsulation member 140 may include an epoxy molding compound, and be formed on the top surface 110a of the first substrate 110 to cover or substantially cover the first semiconductor chip 120 and the first connection electrodes 114a and 114b. The first encapsulation member 140 may be formed to expose the rear surface 120b of the first semiconductor chip 120, and although not illustrated, may be formed to cover the rear surface 120b of the first semiconductor chip 120.

The first through electrodes 150 may be formed in the first encapsulation member 140 to be respectively connected with the first connection electrodes 114 of the first substrate 110. The first through electrodes 150 may be understood as being formed for electrical connection with the top package 300.

The first connection terminals 160 may include solder balls, and may be respectively formed on the first external electrodes 116 arranged on the bottom surface 110b of the first substrate 110. The first connection terminals 160 may serve as means for mounting the package-on-package type semiconductor device 700 in accordance with an embodiment to a main board.

In an embodiment, the middle package 200 may be defined to have a fan-out package structure, and may include second semiconductor chips 220, a second encapsulation member 240, and redistribution lines 270.

Each of the second semiconductor chips 220 may be a WIO2 mobile DRAM memory chip, and may have a front surface 220a on which a plurality of second bonding pads 222 are arranged, a rear surface 220b facing away from the front surface 220a, and side surfaces 220c connecting the front surface 220a and the rear surface 220b. Unlike the second semiconductor chips 220 of the aforementioned embodiments, the second semiconductor chips 220 of the present embodiments may be disposed in a face-up type on the same plane such that they are separated from each other and their front surfaces 220a on which the second bonding pads 222 are arranged face upward.

The second encapsulation member 240 may include an epoxy molding compound, and be formed to expose the front surfaces 220a of the second semiconductor chips 220 and cover or substantially cover the rear surfaces 220b and the side surfaces 220c of the second semiconductor chips 220. While not illustrated, the second encapsulation member 240 may be formed to expose the front surfaces 220a and the rear surfaces 220b of the second semiconductor chips 220 and cover only the side surfaces 220c.

The redistribution lines 270 may be formed of a metal such as copper, and may have one ends 270a which are connected with the second bonding pads 222 of the second semiconductor chips 220 and the other ends 270b extending from the one ends 270a and are disposed on the second encapsulation member 240. While not clearly illustrated, the redistribution lines 270 may include second external electrodes disposed on the other ends 270b and disposed on the second encapsulation member 240.

In an embodiment, the top package 300 may be defined to have a vertical stack package structure, and may include a third substrate 310, third semiconductor chips 320, and third connection members 330. The top package 300 may include a third encapsulation member 340, third connection terminals 360a and 360b, and a spacer 380.

The third substrate 310 may be a printed circuit board, may have a top surface 310a and a bottom surface 310b facing away from the top surface 310a, and may include a plurality of third bond fingers 312 disposed on the top surface 310a and a plurality of third connection electrodes 314 and a plurality of third external electrodes 316 disposed on the bottom surface 310b. On the bottom surface 310b of the third substrate 310, the third external electrodes 316 may be arranged at peripheries, and the third connection electrodes 314 may be arranged inside the third external electrodes 316. While not illustrated, the third substrate 310 may further include via patterns formed within the third substrate 310. By the via patterns, the third bond fingers 312 arranged on the top surface 310a of the third substrate 310 and the third connection electrodes 314 and the third external electrodes 316 arranged on the bottom surface 310b of the third substrate 310 may be electrically interconnected.

Each of the third semiconductor chips 320 may be a low power DDR memory chip, may have a front surface 320a and a rear surface 320b facing away from the front surface 320a, and may include a plurality of third bonding pads 322 arranged on the peripheral portions of the front surface 320a. At least two, for example, two such third semiconductor chips 320 may be vertically stacked in a face-up type on the top surface 310a of the third substrate 310. The stacking of the third semiconductor chips 320 may be carried out by the medium of adhesive members (not illustrated), and the spacer 380 may be interposed between the stacked third semiconductor chips 320.

The third connection members 330 may include conductive wires, and may be formed to electrically interconnect the third bonding pads 322 of the third semiconductor chips 320 and the third bond fingers 312 of the third substrate 310 disposed adjacent to the third bonding pads 322 of the third semiconductor chips 320.

The third encapsulation member 340 may include an epoxy molding compound, and may be formed on the top surface 310a of the third substrate 310 to cover or substantially cover the third semiconductor chips 320 and the third bond fingers 312.

The third connection terminals 360a and 360b may include solder balls, and may be respectively formed on the third connection electrodes 314 and the third external electrodes 316 arranged on the bottom surface 310b of the third substrate 310. The third connection terminals 360a for connection to the middle package 200 formed on the third connection electrodes 314 may be formed to contact the other ends 270b of the redistribution lines 270 of the middle package 200. The third connection terminals 360b for connection to the bottom package 100 formed on the third external electrodes 316 may be formed to contact the through electrodes 150 of the bottom package 100.

The third connection terminals 360b for connection to the bottom package 100 formed on the third external electrodes 316 may ensure stable electrical connection between the first through electrodes 150 of the bottom package 100 and the third external electrodes 316 of the top package 300 and may be defined to have a diameter larger than the thickness of the middle package 200.

Figure 4:
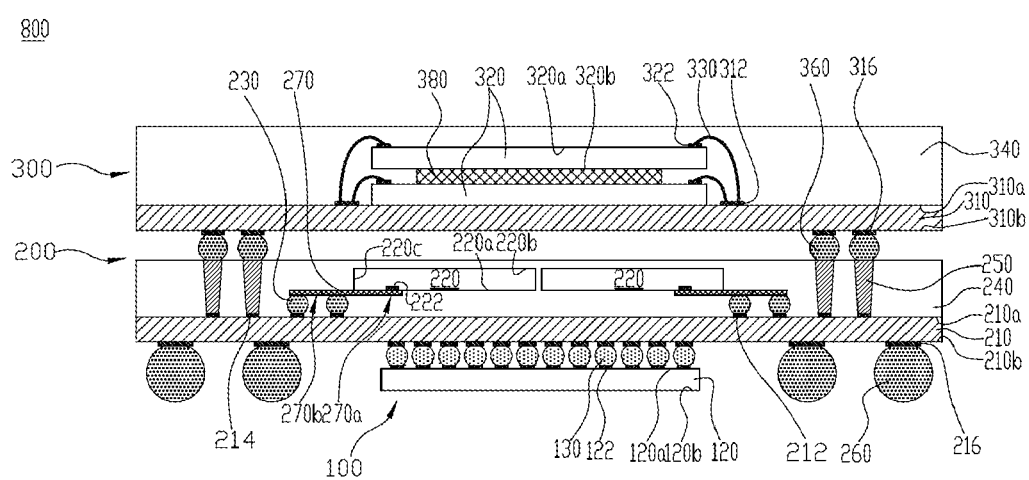
FIG. 4 is a cross-sectional view illustrating a representation of an example of a package-on-package type semiconductor device in accordance with an embodiment.

Referring to FIG. 4, a semiconductor device 800 in accordance with an embodiment may include a bottom package 100, a middle package 200, and a top package 300.

In an embodiment, the bottom package 100 may be flip chip-bonded to a bottom surface 210b of a second substrate 210 of the middle package 200, and may include a first semiconductor chip 120 and first connection members 130.

The first semiconductor chip 120 may be a logic chip, may have a front surface 120a and a rear surface 120b facing away from the front surface 120a, and may include a plurality of first bonding pads 122 arranged on the front surface 120a.

The first connection members 130 may be respectively formed on the first bonding pads 122 of the first semiconductor chip 120. By the first connection members 130, the first semiconductor chip 120 may be flip-chip bonded to the bottom surface 210b of the second substrate 210 of the middle package 200 in a face-up type in such a manner that the first bonding pads 122 arranged on the front surface 120a of the first semiconductor chip 120 face upward.

While not illustrated, an underfill member may be formed between the front surface 120a of the first semiconductor chip 120 including the first connection members 130 and the bottom surface 210b of the second substrate 210.

In an embodiment, the middle package 200 may be defined to have a fan-out package structure, and may include the second substrate 210, second semiconductor chips 220, and second connection members 230. The middle package 200 may include redistribution lines 270, a second encapsulation member 240, second through electrodes 250, and second connection terminals 260.

The second substrate 210 may be a printed circuit board, and may have a top surface 210a on which a plurality of second bond fingers 212 and a plurality of second connection electrodes 214 are formed. The second substrate 210 may have a bottom surface 210b facing away from the top surface 210a and on which a plurality of second external electrodes 216 are formed. While not illustrated, the second substrate 210 may further include via patterns formed within the second substrate 210. By the via patterns, the second bond fingers 212 and the second connection electrodes 214 arranged on the top surface 210a of the second substrate 210 and the second external electrodes 216 arranged on the bottom surface 210b of the second substrate 210 may be electrically interconnected.

Each of the second semiconductor chips 220 may be a WIO2 mobile DRAM memory chip, and may have a front surface 220a on which a plurality of second bonding pads 222 are arranged. Each of the second semiconductor chips 220 may have a rear surface 220b facing away from the front surface 220a, and side surfaces 220c connecting the front surface 220a and the rear surface 220b. The second semiconductor chips 220 may be disposed in a face-down type on the same plane in such a way as to be separated from each other. The second bonding pads 222 of the second semiconductor chips 220 may be arranged on the peripheral portions of the front surfaces 220a opposite to each other.

The redistribution lines 270 may be formed of a metal with excellent conductivity such as copper, and may have one ends 270a connected with the second bonding pads 222 of the second semiconductor chips 220 and the other ends 270b extending from the one ends 270a and may be disposed opposite to the one ends 270a. While not clearly illustrated, the redistribution lines 270 may include second external electrodes disposed on the other ends 270b and on which the second connection terminals 260 are to be formed.

The second connection members 230 may include bumps, may be formed on the second external electrodes disposed on the other ends 270b of the redistribution lines 270, and may contact the second bond fingers 212 of the second substrate 210. Accordingly, the second semiconductor chips 220 including the redistribution lines 270 may be fixed to the top surface 210a of the second substrate 210 by the second connection members 230.

The second encapsulation member 240 may include an epoxy molding compound, and be formed to cover or substantially cover the second semiconductor chips 220 disposed to be separated from each other, including the redistribution lines 270 and the second connection members 230. While not illustrated, the second encapsulation member 240 may be formed to expose the rear surfaces 220b of the second semiconductor chips 220.

The second through electrodes 250 may be formed to vertically pass through the second encapsulation member 240, and may be formed to be respectively connected with the second connection electrodes 214. The second through electrodes 250 may include a conductive layer.

The second connection terminals 260 may include solder balls, and may be respectively formed on the second external electrodes 216 formed on the bottom surface 210b of the second substrate 210. The second connection terminals 260 may be defined to have a diameter larger than the overall thickness of the bottom package 100, that is, the sum of the thickness of the first semiconductor chip 120 and the thickness of the first connection members 130, for stable mounting to a mother board.

In an embodiment, the top package 300 may be defined to have a vertical stack package structure, and may include a third substrate 310, third semiconductor chips 320, and third connection members 330. The top package 300 may include a third encapsulation member 340, third connection terminals 360, and a spacer 380.

The third substrate 310 may be a printed circuit board, may have a top surface 310a and a bottom surface 310b facing away from the top surface 310a, and may include a plurality of third bond fingers 312 disposed on the top surface 310a and a plurality of third external electrodes 316 disposed on the bottom surface 310b. While not illustrated, the third substrate 310 may further include via patterns formed therein. By the via patterns, the third bond fingers 312 arranged on the top surface 310a of the third substrate 310 and the third external electrodes 316 arranged on the bottom surface 310b of the third substrate 310 may be electrically interconnected.

Each of the third semiconductor chips 320 may be a low power DDR memory chip, may have a front surface 320a and a rear surface 320b facing away from the front surface 320a, and may include a plurality of third bonding pads 322 arranged on the peripheral portions of the front surface 320a. At least two, for example, two such third semiconductor chips 320 may be vertically stacked in a face-up type on the top surface 310a of the third substrate 310. The stacking of the third semiconductor chips 320 may be carried out by the medium of adhesive members (not illustrated), and the spacer 380 may be interposed between the stacked third semiconductor chips 320.

The third connection members 330 may include conductive wires, and may be formed to electrically interconnect the third bonding pads 322 of the third semiconductor chips 320 and the third bond fingers 312 of the third substrate 310 disposed adjacent to the third bonding pads 322 of the third semiconductor chips 320.

The third encapsulation member 340 may include an epoxy molding compound, and may be formed on the top surface 310a of the third substrate 310 to cover or substantially cover the third semiconductor chips 320 and the third bond fingers 312.

The third connection terminals 360 may include solder balls, may be respectively formed on the third external electrodes 316 arranged on the bottom surface 310b of the third substrate 310, and may be physically and electrically connected with the second through electrodes 250 of the middle package 200.

The semiconductor devices in accordance with the above-described various embodiments may be applied to various kinds of semiconductor devices and package modules having the same.

Figure 5:
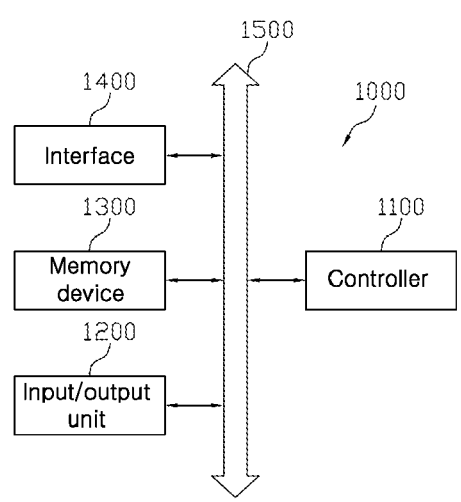
FIG. 5 is a block diagram illustrating a representation of an example of an electronic system to which the package-on-package type semiconductor devices in accordance with the various embodiments may be applied.

Referring to FIG. 5, an electronic system 1000 to which the semiconductor devices in accordance with the various embodiments may be applied may include a controller 1100, an input/output unit 1200, and a memory device 1300. The controller 1100, the input/output unit 1200 and the memory device 1300 may be electrically coupled with one another through a bus 1500 which provides data movement paths.

For example, the controller 1100 may include at least any one of a microprocessor, a digital signal processor, a microcontroller, and logic devices capable of performing similar functions to these components. The controller 1100 and the memory device 1300 may include the semiconductor devices in accordance with the various embodiments. The input/output unit 1200 may include at least one selected among a keypad, a keyboard, a display device, and so forth.

The memory device 1300 may store data and/or commands to be executed by the controller 1100. The memory device 1300 may include a volatile memory device such as a DRAM and/or a nonvolatile memory device such as a flash memory. For example, a flash memory may be mounted to an information processing system such as a mobile terminal and a desktop computer. Such a flash memory may be configured by an SSD (solid state drive). In this example, the electronic system 1000 may stably store a large amount of data in a flash memory system.

Such an electronic system 1000 may further include an interface 1400 for transmitting data to a communication network or receiving data from a communication network. The interface 1400 may be a wired or wireless type. For example, the interface 1400 may include an antenna or a wired/wireless transceiver.

Meanwhile, although not illustrated, the electronic system 1000 may further include an application chipset, a camera image processor (CIP), and so forth.

The electronic system 1000 may be realized as a mobile system, a personal computer, a computer for an industrial use or a logic system which performs various functions. For example, the mobile system may be any one among a personal digital assistant (PDA), a portable computer, a web tablet, a mobile phone, a smart phone, a wireless phone, a laptop computer, a memory card, a digital music system and an information transmission/reception system.

In the example where the electronic system 1000 is equipment capable of performing wireless communication, the electronic system 1000 may be used in a communication system such as CDMA (code division multiple access), GSM (global system for mobile communication), NADC (North American digital cellular), E-TDMA (enhanced-time division multiple access), WCDMA (wideband code division multiple access), CDMA2000, LTE (long term evolution) and Wibro (wireless broadband Internet).

Figure 6:
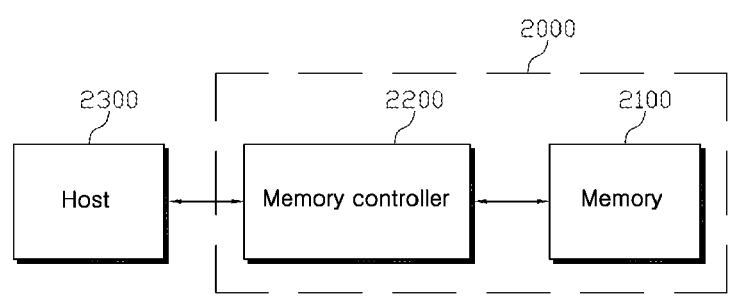
FIG. 6 is a block diagram illustrating a representation of an example of a memory card which includes the package-on-package type semiconductor devices in accordance with the various embodiments.

Referring to FIG. 6, a memory card 2000 may include the package-on-package type semiconductor devices in accordance with the various embodiments. The memory card 2000 may include a memory 2100 and a memory controller 2200. For example, without a limiting sense, the memory 2100 and the memory controller 2200 may include a nonvolatile memory device. The memory 2100 and the memory controller 2200 may store data or read stored data.

The memory 2100 may include at least any one among nonvolatile memory devices to which the stack package in accordance with the various embodiments is applied. The memory controller 2200 may control the memory 2100 to read stored data or store data, in response to a read/write request from a host 2300.

While various embodiments have been described above, it will be understood to those skilled in the art that the embodiments described are by way of example only. Accordingly, the package-on-package type semiconductor devices including a fan-out memory device described herein should not be limited based on the described embodiments.

What is claimed is:

1. A semiconductor device comprising:
a bottom package embedded with a first semiconductor chip;
a middle package stacked over the bottom package, and embedded with at least two second semiconductor chips in a fan-out structure; and
a top package stacked over the middle package, and embedded with third semiconductor chips,
wherein the middle package comprises:
the two second semiconductor chips disposed in a face-down type such that the two second semiconductor chips are separated from each other and front surfaces of the second semiconductor chips face downward over pluralities of second bonding pads arranged on the front surfaces of the two second semiconductor chips, respectively;
a second encapsulation member formed to expose the front surfaces and substantially cover side surfaces and rear surfaces of the second semiconductor chips; and
redistribution lines having one ends connected with the second bonding pads of the second semiconductor chips and the other ends extend from the one ends and disposed over corresponding portions of the second encapsulation member.

2. The semiconductor device according to claim 1, wherein the first semiconductor chip of the bottom package includes a logic chip, the second semiconductor chips of the middle package include wide input/output 2 (WIO2) mobile dynamic random-access memory (DRAM) memory chips, and the third semiconductor chips of the top package include low power double data rate (DDR) memory chips.

3. The semiconductor device according to claim 2, wherein the bottom package comprises:
a first substrate having a top surface;
a plurality of first bond fingers and a plurality of first connection electrodes formed over the top surface;
a bottom surface facing away from the top surface;
a plurality of first external electrodes arranged under the bottom surface;
the first semiconductor chip disposed over a portion of the first substrate and located over the formation of the first bond fingers, in a face-down type such that a front surface of the first semiconductor chip, over the formation of the first bonding pads, faces downward;
first connection members respectively interposed between the first bond fingers of the first substrate and the first bonding pads of the logic chip to electrically connect the first bond fingers and the first bonding pads;
a first encapsulation member formed over the top surface of the first substrate to substantially cover the first semiconductor chip;
first through electrodes formed over portions of the first encapsulation member on both sides of the first semiconductor chip to be respectively connected with the first connection electrodes; and
first connection terminals respectively formed under the first external electrodes arranged under the bottom surface of the first substrate.

4. The semiconductor device according to claim 3, wherein the first connection members include bumps, and the first connection terminals include solder balls.

5. The semiconductor device according to claim 3, wherein the first encapsulation member is formed to expose a rear surface of the first semiconductor chip.

6. The semiconductor device according to claim 1, wherein the middle package comprises:
second connection terminals respectively formed over the other ends of the redistribution lines electrically connected with the bottom package.

7. The semiconductor device according to claim 1, wherein the second bonding pads of the second semiconductor chips are arranged over peripheral portions of the front surfaces opposite to each other.

8. The semiconductor device according to claim 6, wherein the second connection terminals include solder balls.

9. The semiconductor device according to claim 1, wherein the middle package further comprises:
second through electrodes formed in the second encapsulation member and respectively connected with the other ends of the redistribution lines.

10. The semiconductor device according to claim 2, wherein the top package comprises:
a third substrate having a top surface;
a plurality of third bond fingers formed over the top surface;
a bottom surface facing away from the top surface;
a plurality of third external electrodes arranged under the bottom surface;
the third semiconductor chips stacked over the top surface of the third substrate in a face-up type such that front surfaces of the third semiconductor chips face upward, pluralities of third bonding pads formed over front surfaces of the third semiconductor chips, respectively;
third connection members electrically connecting the third bond fingers of the third substrate and the third bonding pads of the third semiconductor chips;
a third encapsulation member formed over the top surface of the third substrate to substantially cover the third semiconductor chips and the third connection members; and
third connection terminals respectively formed over the third external electrodes of the third substrate electrically connected with any one of the bottom package or the middle package.

11. The semiconductor device according to claim 10, wherein the top package further comprises:
a spacer interposed between the stacked third semiconductor chips.

12. The semiconductor device according to claim 10, wherein the third connection members include conductive wires, and the third connection terminals include solder balls.

13. The semiconductor device according to claim 10, wherein the third bonding pads are located on peripheral portions of the front surfaces of the third semiconductor chips.

* * * * *